United States Patent
Zang et al.

(10) Patent No.: US 9,583,479 B1
(45) Date of Patent: Feb. 28, 2017

(54) SEMICONDUCTOR CHARGE PUMP WITH IMBEDDED CAPACITOR

(71) Applicant: GLOBALFOUNDRIES Inc., Grand Cayman (KY)

(72) Inventors: Hui Zang, Guilderland, NY (US); Min-hwa Chi, San Jose, CA (US)

(73) Assignee: GLOBALFOUNDRIES INC., Grand Gayman (KY)

( * ) Notice: Subject to any disclaimer, the term of this patent is extended or adjusted under 35 U.S.C. 154(b) by 0 days.

(21) Appl. No.: 14/995,324

(22) Filed: Jan. 14, 2016

(51) Int. Cl.
| H01L 29/94 | (2006.01) |
| H01L 27/02 | (2006.01) |
| H01L 49/02 | (2006.01) |
| H01L 29/78 | (2006.01) |
| H01L 29/66 | (2006.01) |
| H01L 21/8234 | (2006.01) |
| H01L 21/311 | (2006.01) |

(52) U.S. Cl.
CPC .... H01L 27/0222 (2013.01); H01L 21/31105 (2013.01); H01L 21/823431 (2013.01); H01L 28/40 (2013.01); H01L 29/66181 (2013.01); H01L 29/66477 (2013.01); H01L 29/66545 (2013.01); H01L 29/78 (2013.01); H01L 29/785 (2013.01)

(58) Field of Classification Search
CPC ..................... H01L 27/0222; H01L 27/0207
USPC .......................................................... 257/299
See application file for complete search history.

(56) References Cited

U.S. PATENT DOCUMENTS

| 4,482,985 A * | 11/1984 | Itoh ................... G05F 1/465 257/299 |
| 4,491,746 A * | 1/1985 | Koike ................... G05F 3/205 257/299 |
| 4,559,548 A * | 12/1985 | Iizuka ................... G05F 3/205 257/299 |
| 2007/0181918 A1* | 8/2007 | Wada ................. H01L 23/5223 257/288 |
| 2012/0223395 A1* | 9/2012 | Liaw ..................... G11C 17/12 257/390 |
| 2015/0097220 A1* | 4/2015 | Ponoth ............... H01L 27/0629 257/296 |

* cited by examiner

*Primary Examiner* — Andy Huynh
*Assistant Examiner* — Sitaramarao S Yechuri
(74) *Attorney, Agent, or Firm* — Heslin Rothenberg Farley & Mesiti P.C.

(57) ABSTRACT

A charge pump for an integrated circuit includes a substrate, first and second transistors and a capacitor. The first transistor includes first source and first drain regions disposed within the substrate and defining a first channel therebetween. The first source and first drain regions are implanted with one of an n-type and a p-type dopant. The second transistor includes second source and second drain regions disposed within the substrate and defining a second channel therebetween. The second source and second drain regions implanted with the same type dopant as the first source region. The capacitor includes a metal terminal and a substrate terminal with a dielectric therebetween. The substrate terminal is disposed within the substrate and implanted with the same type dopant as the first source region. The substrate terminal contacts the first drain region and second source region within the substrate to provide electrical continuity therebetween.

18 Claims, 21 Drawing Sheets

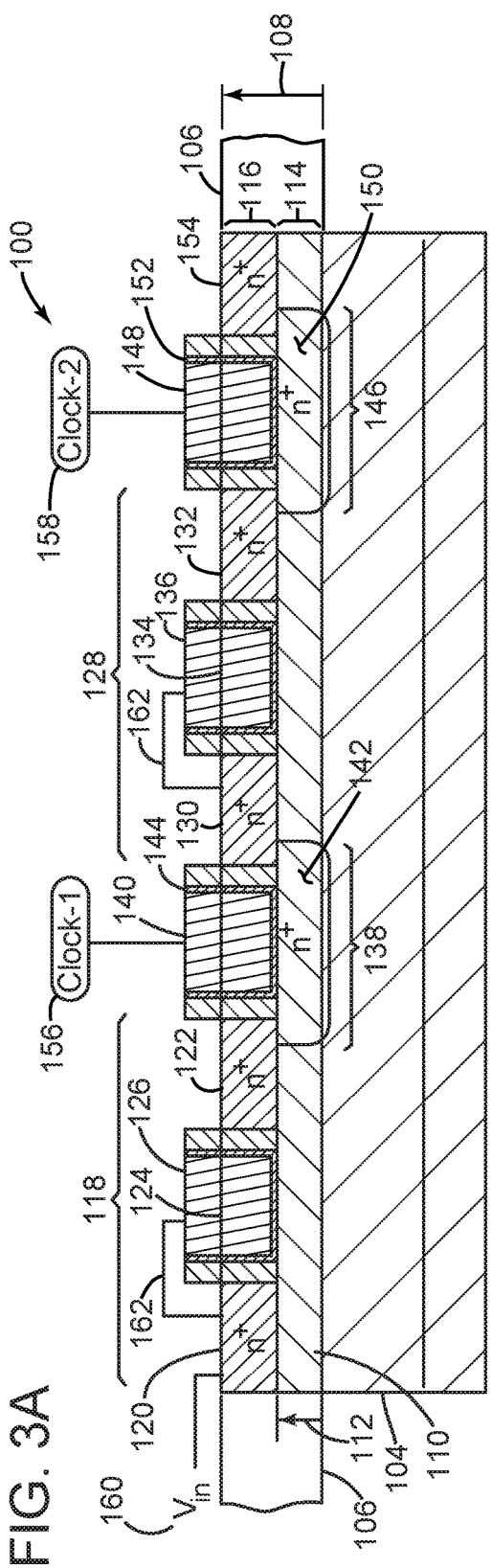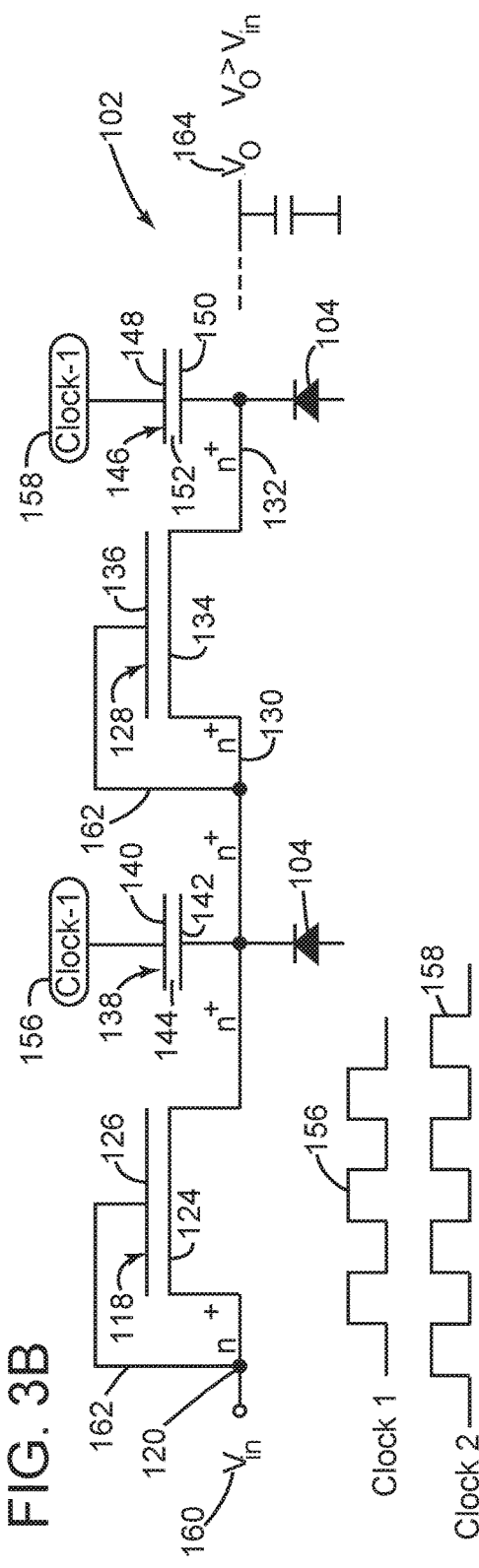

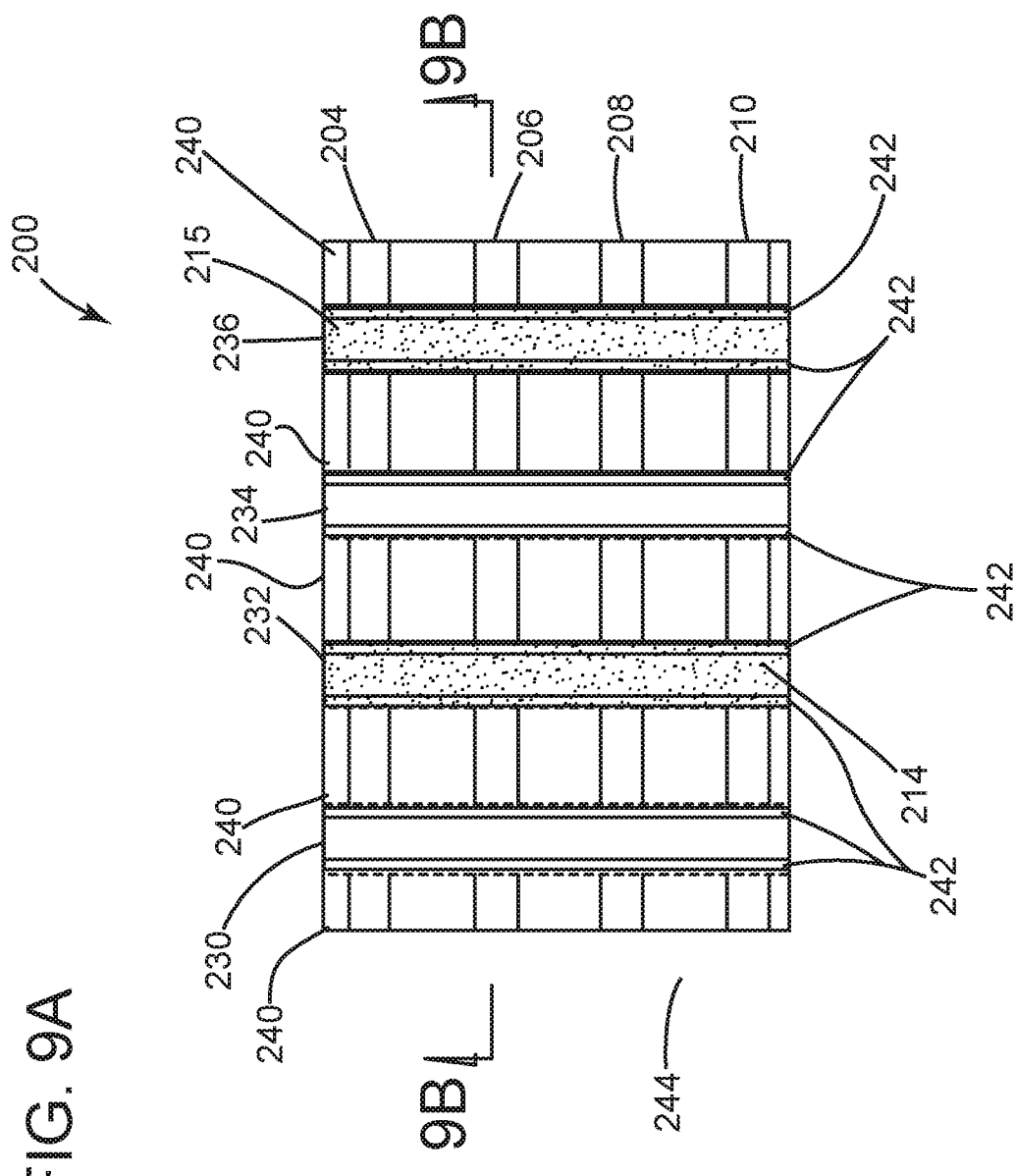

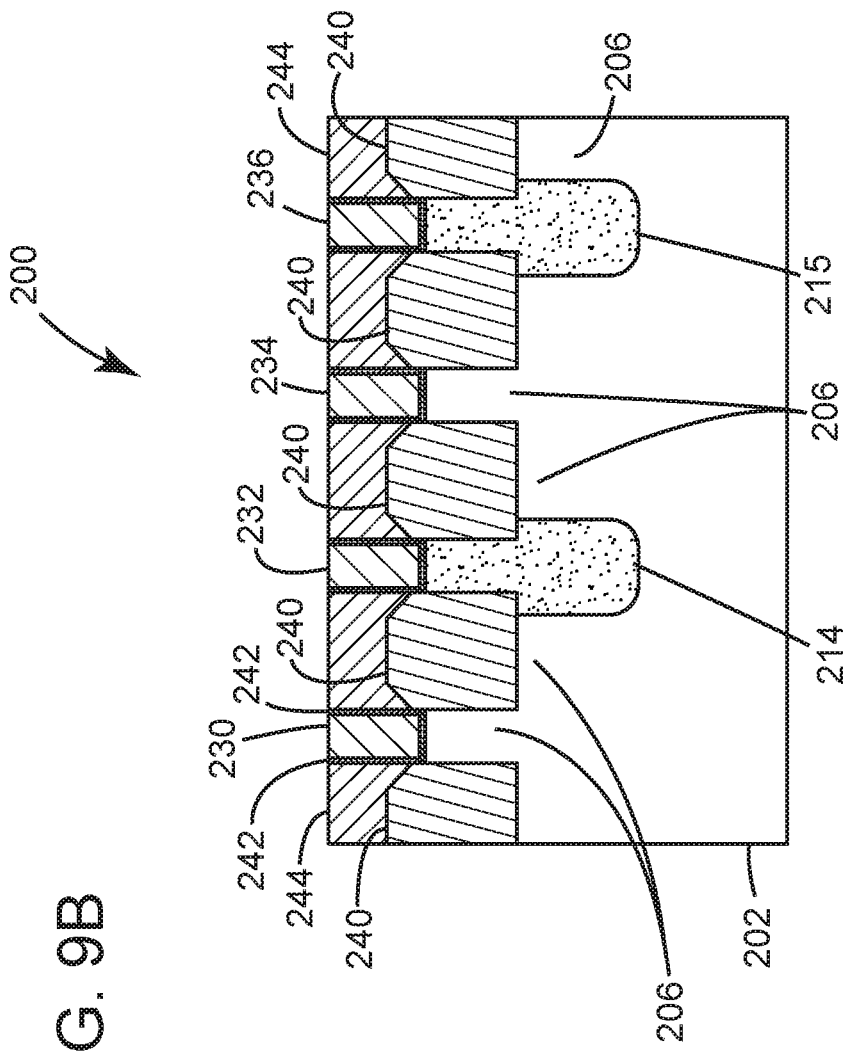

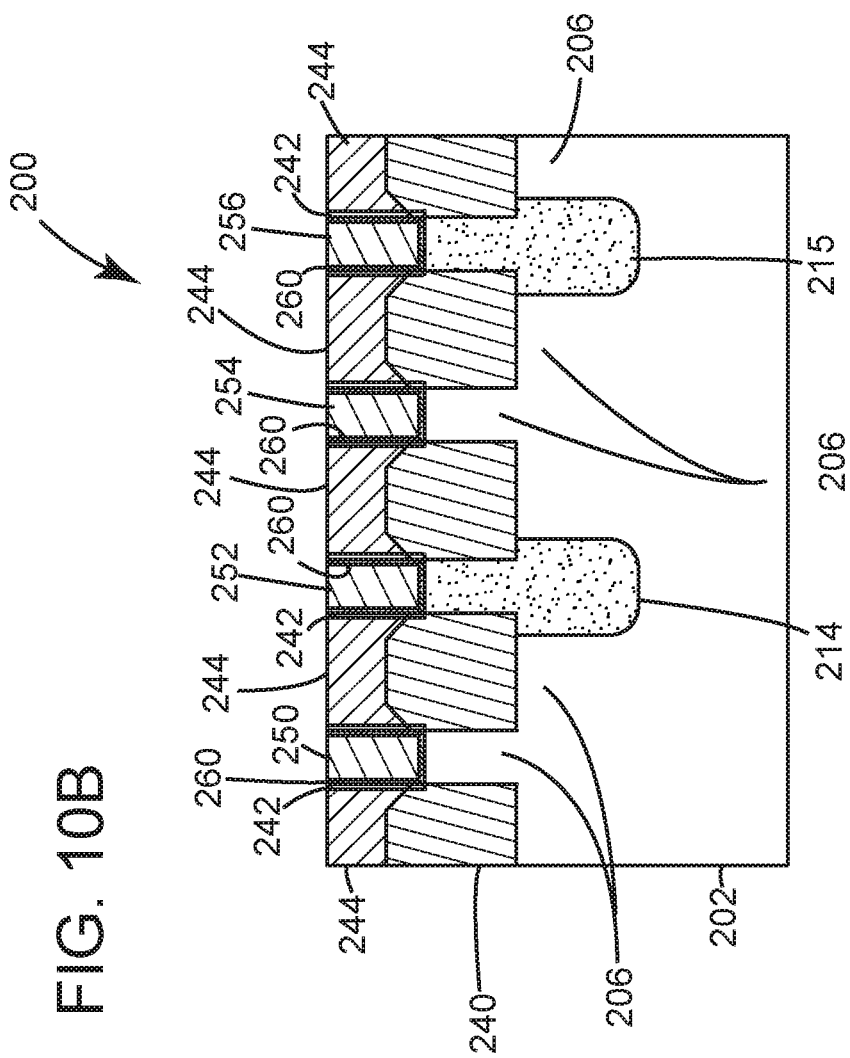

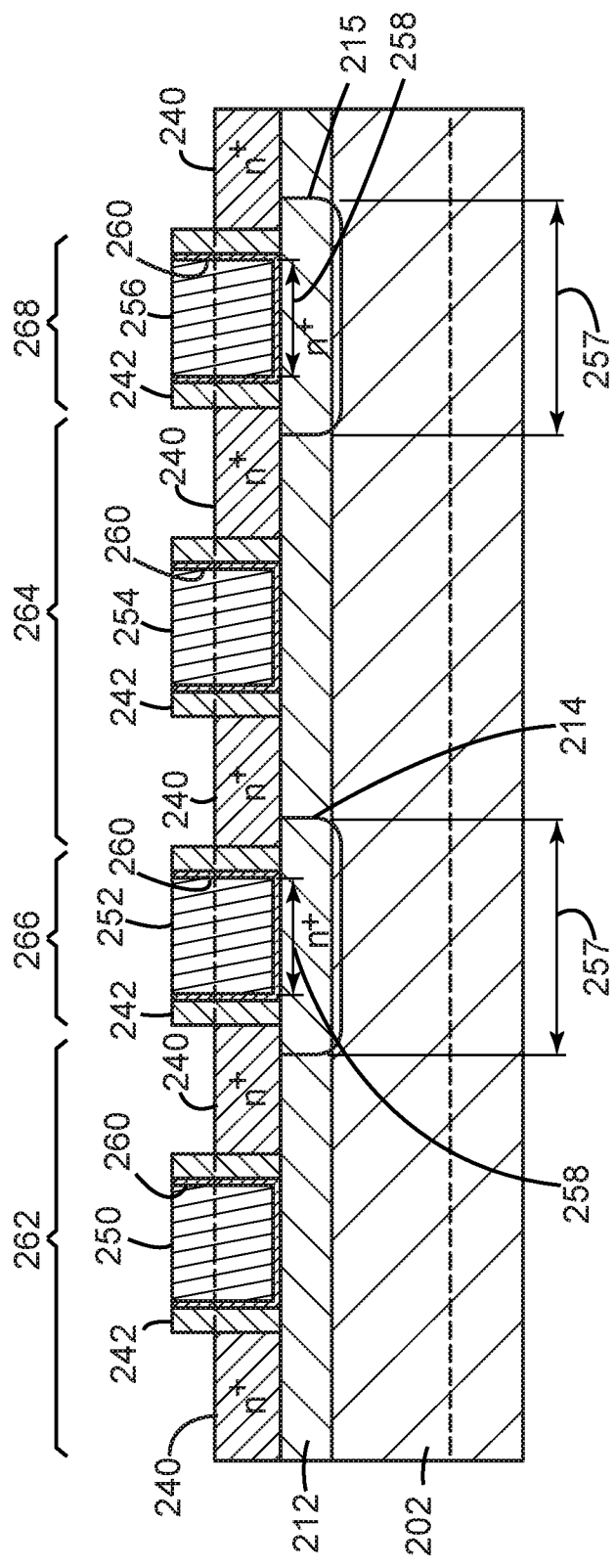

SEMICONDUCTOR CHARGE PUMP WITH IMBEDDED CAPACITOR

TECHNICAL FIELD

The present invention relates to semiconductor devices and methods of fabricating the same. More specifically, the invention relates to various methods of forming charge pumps for electrical interconnection systems in integrated circuits.

BACKGROUND

A charge pump (also known as a Dickson charge pump or Dickson multiplier) takes a low voltage DC supply as its input, and so is a kind of low voltage DC to DC converter that uses capacitors as energy storage elements to create either a higher or lower voltage power source at the charge pump's output. In addition to the DC input, the circuit generally requires a feed of two clock pulse trains with an amplitude swinging between the DC supply rails. These pulse trains usually have opposite polarities. Charge pump circuits are capable of high efficiencies, sometimes as high as 90-95% while being electrically simple circuits. Charge pumps can provide double voltages, triple voltages, halve voltages, invert voltages, fractionally multiply or scale voltages (such as ×3/2, ×4/3, ×2/3, etc.) or generate arbitrary voltages, depending on the controller and circuit topology.

However, with constant down-scaling and increasingly demanding requirements to the speed and functionality of ultra-high density integrated circuits, the interconnection wiring between the transistors and capacitors of a charge pump circuit becomes increasingly problematic. In order for the charge pumps 40 (in FIG. 2A) and 50 (in FIG. 2B) to function, electrical continuity must be established between each transistor's source and gate, and between the clock signals and the capacitors. Additionally, electrical continuity must be established between each capacitor, the drain of one transistor and the source of an adjacent transistor. In prior art integrated circuits, these charge pump interconnections often involve a plurality of metal interconnections and contacts between capacitors and transistors that can take up space, and/or extend for relatively long distances and contacts (or vias) through several layers within the integrated circuit.

Additionally, as the technology is down-scaled, the supply voltage (typically referred to as Vdd) is also down-scaled. The lower the supply voltage, the more stages are required in a charge pump circuit to meet various voltage requirements throughout the integrated circuit. Therefore a compact design for an integrated circuit charge pump becomes an ever-more increasing premium as the technology is scaled.

Accordingly, there is a need for a charge pump circuit design, and method of making the same, that reduces the amount of metal interconnection wiring required between capacitors and transistors in a charge pump circuit. Additionally, there is a need for a more compact design for a charge pump circuit compared to prior art charge pumps.

BRIEF DESCRIPTION

The present invention offers advantages and alternatives over the prior art by providing a charge pump for an integrated circuit and methods of making the same. The charge pump having a capacitor with a substrate terminal disposed within a substrate. The substrate terminal making contact with the source of an adjacent first transistor and the drain of an adjacent second transistor to provide electrical continuity therebetween.

A charge pump in accordance with one or more aspects of the present invention includes a substrate, a first transistor, a second transistor and a capacitor. The first transistor includes first source and first drain regions disposed within the substrate and defining a first channel therebetween. The first source and first drain regions are implanted with one of an n-type and a p-type dopant. The second transistor includes second source and second drain regions disposed within the substrate and defining a second channel therebetween. The second source and second drain regions are implanted with the same type dopant as the first source region. The capacitor includes a metal terminal and a substrate terminal with a dielectric therebetween. The substrate terminal is disposed within the substrate and implanted with the same type dopant as the first source region. The substrate terminal contacts the first drain region and second source region within the substrate to provide electrical continuity therebetween.

In another aspect of the invention, a method of making a charge pump includes providing a substrate for the charge pump. The method also includes doping the substrate with one of a p-type and an n-type dopant to form a first source region and first drain region of a first transistor within the substrate, the first source region and first drain region defining a first channel region therebetween. The method also includes doping the substrate with the same type dopant to form a second source region and second drain region of a second transistor within the substrate, the second source region and second drain region defining a second channel region therebetween. Also the method includes doping the substrate with the same type dopant to form a first substrate terminal of a first capacitor within the substrate such that the first substrate terminal contacts the first drain region and second source region within the substrate to provide electrical continuity therebetween to form the charge pump.

DRAWINGS

The invention will be more fully understood from the following detailed description taken in conjunction with the accompanying drawings, in which:

FIG. 3A is a simplified cross sectional view of an exemplary embodiment of a charge pump for an integrated circuit device in accordance with the present invention;

Figure 4:
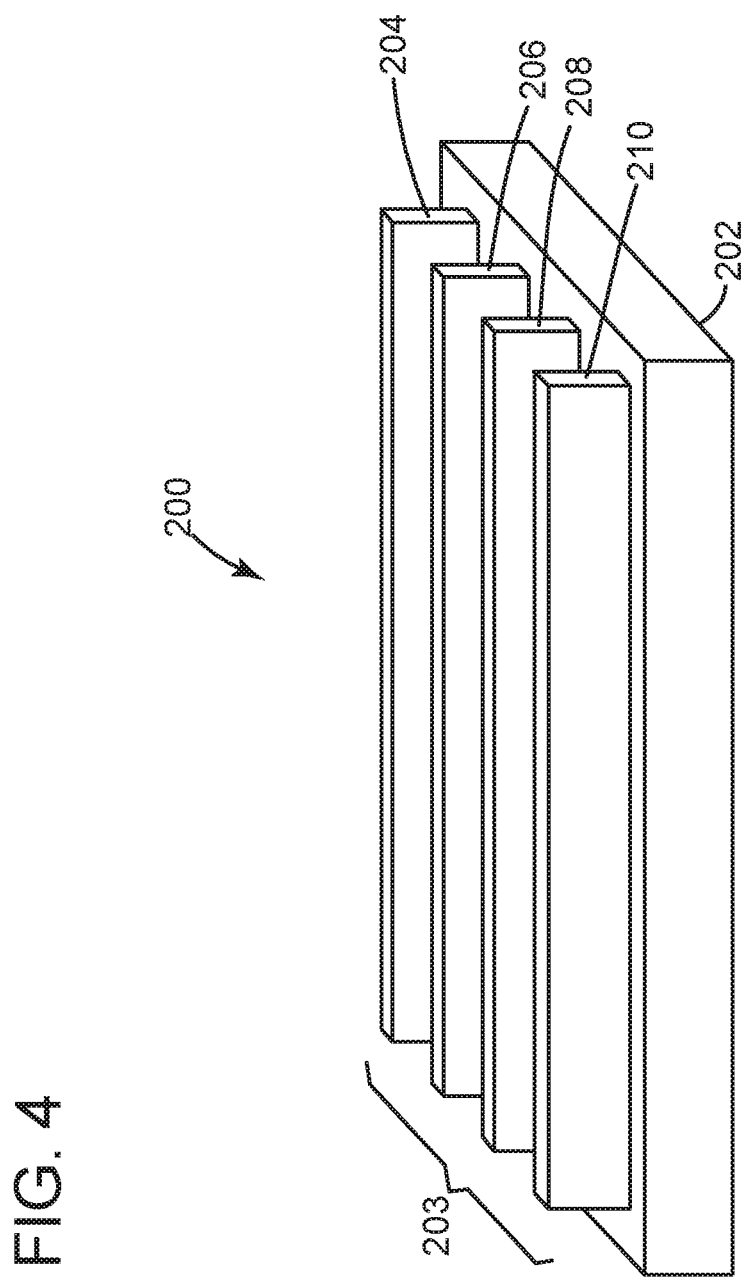
Figure 5:
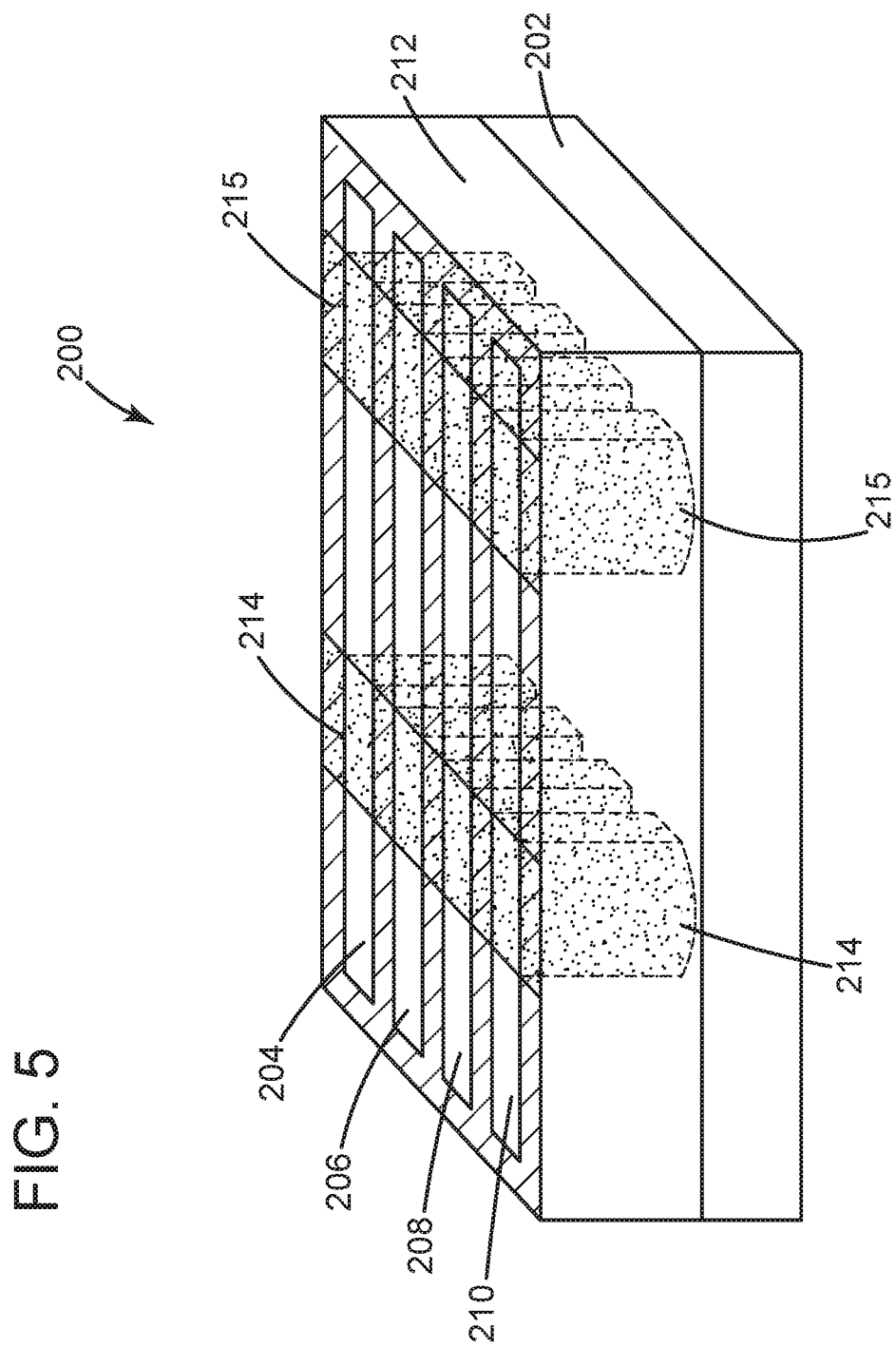
Figure 6A:
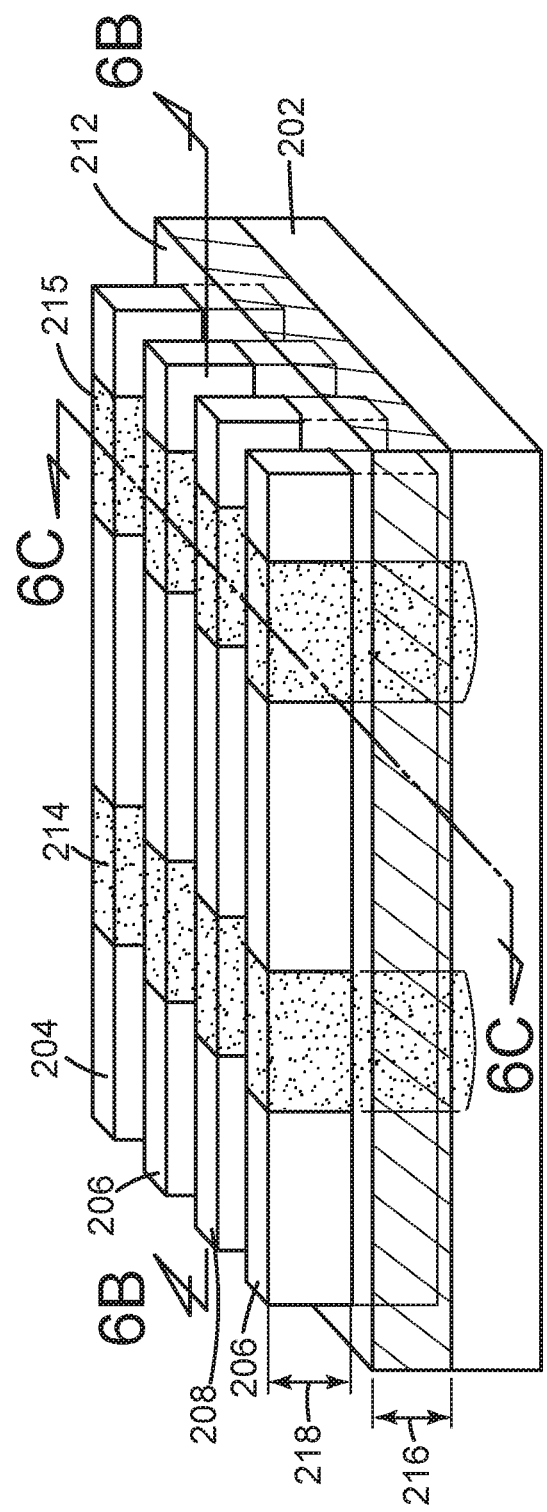
Figure 6B:
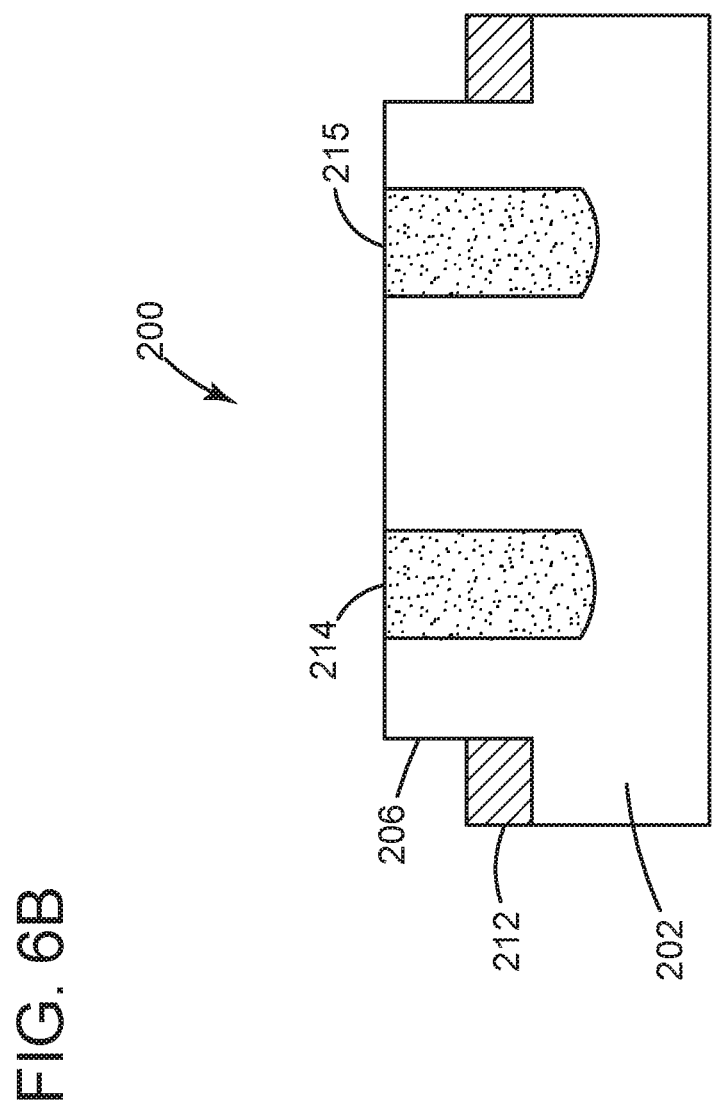
Figure 6C:
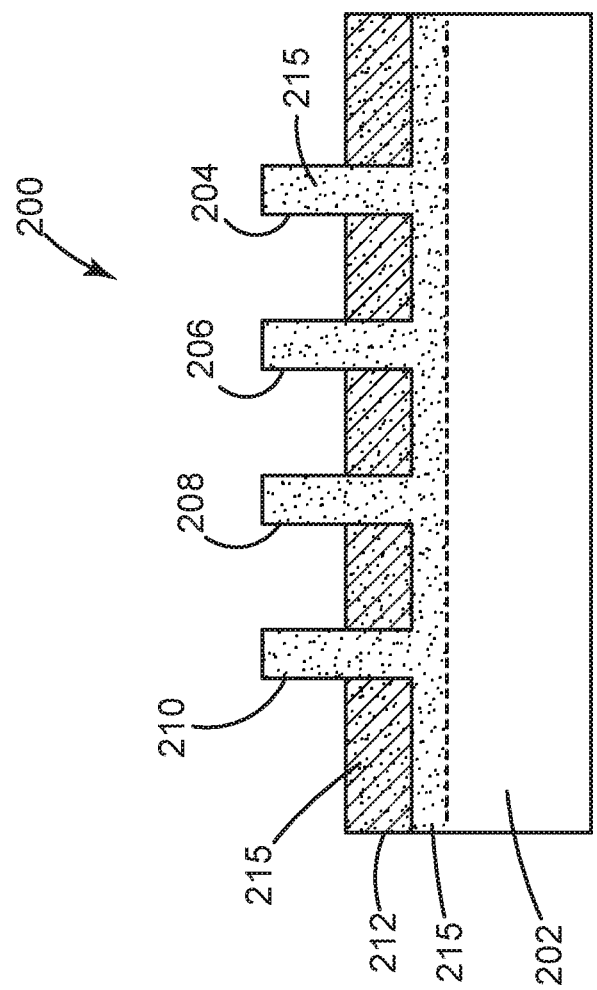
Figure 6C:
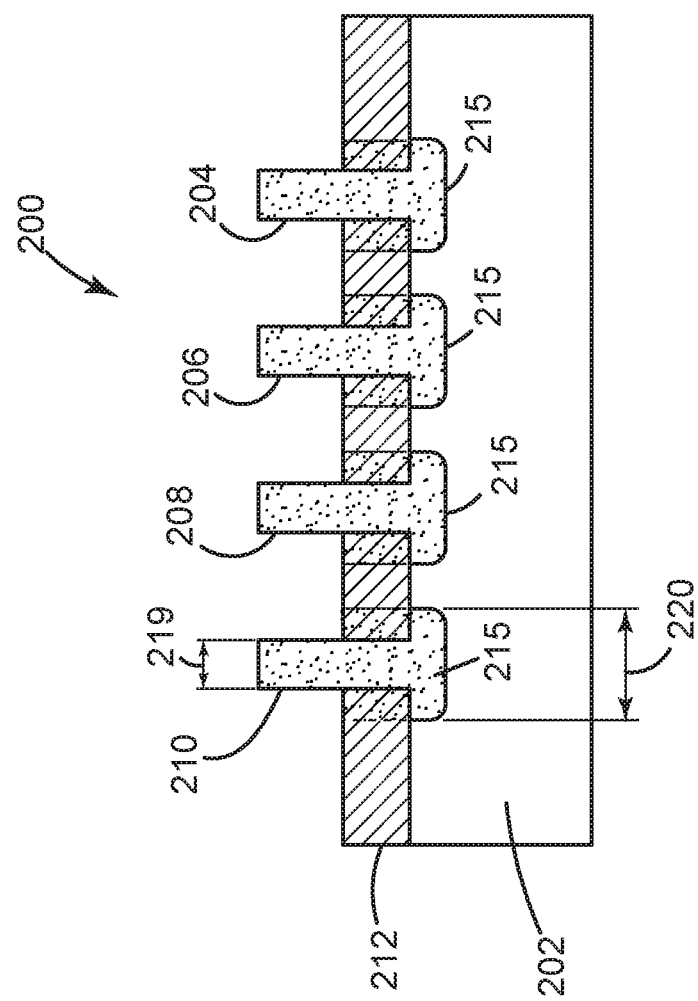
Figure 7A:
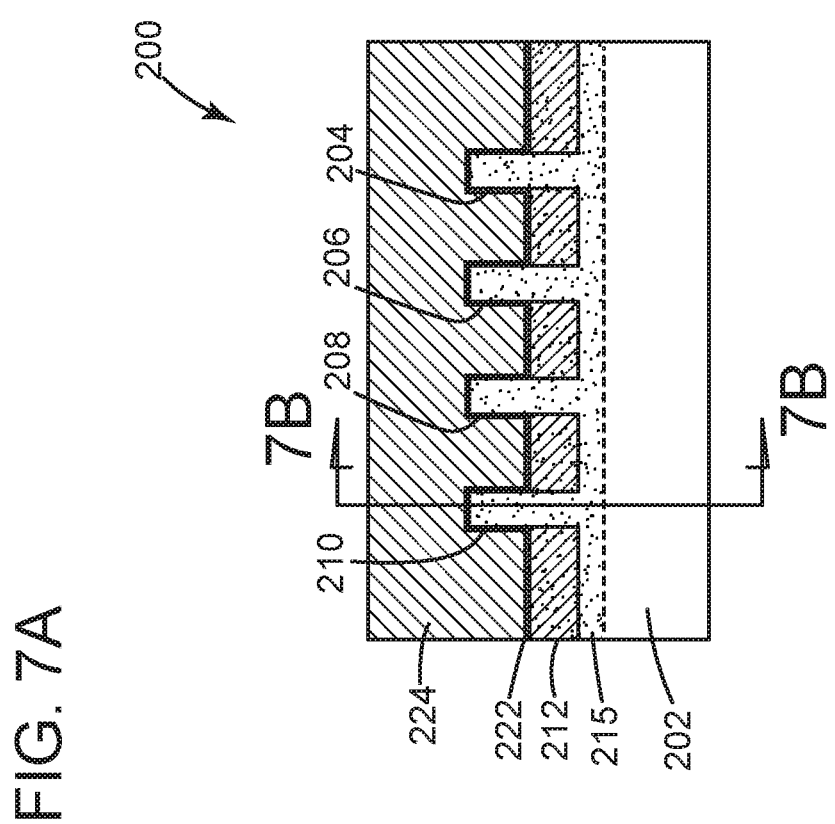
Figure 7B:
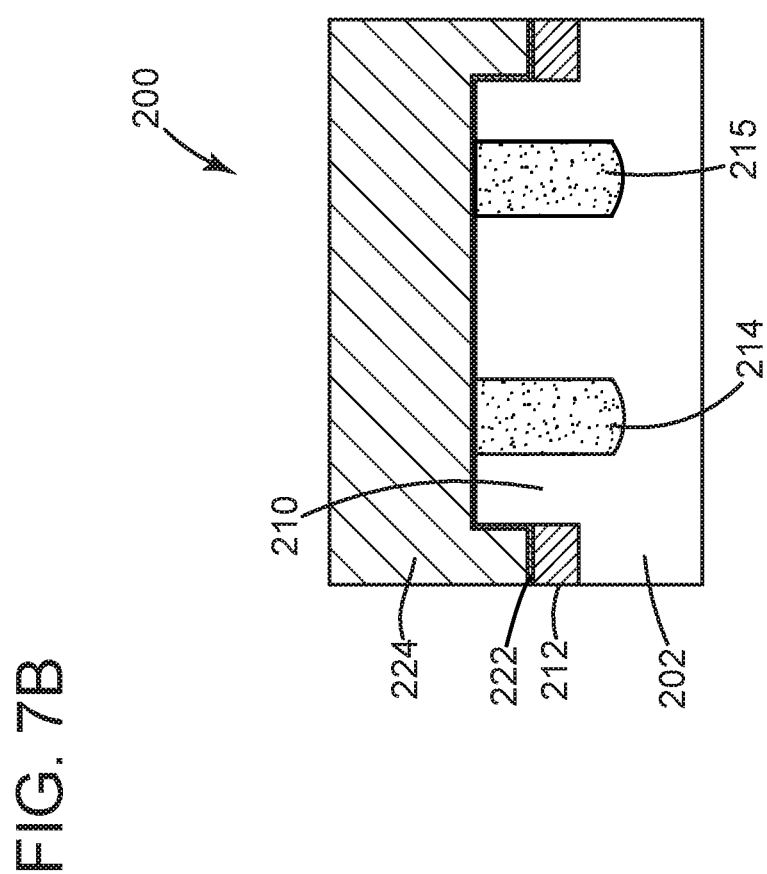
Figure 8A:
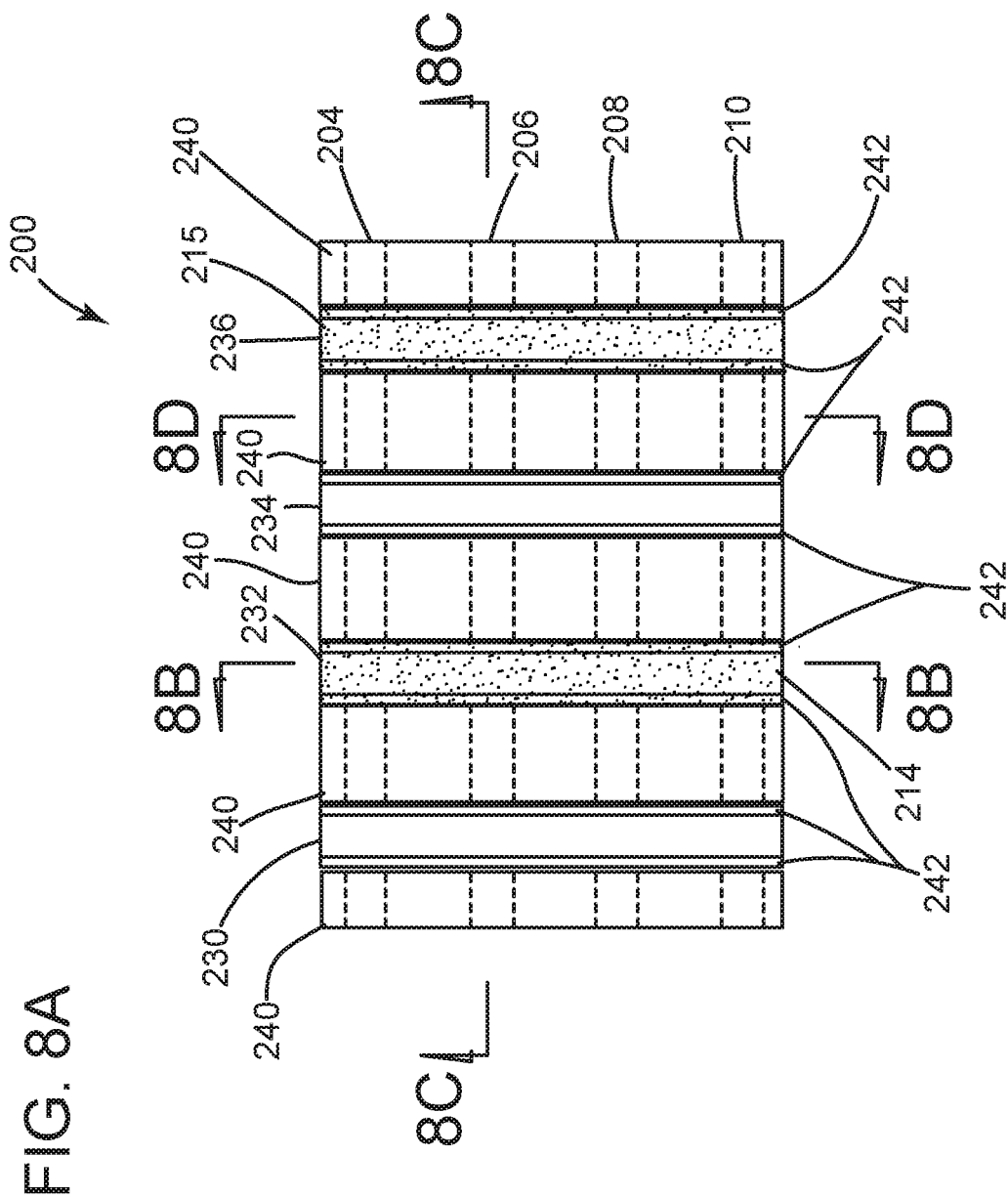
Figure 8B:
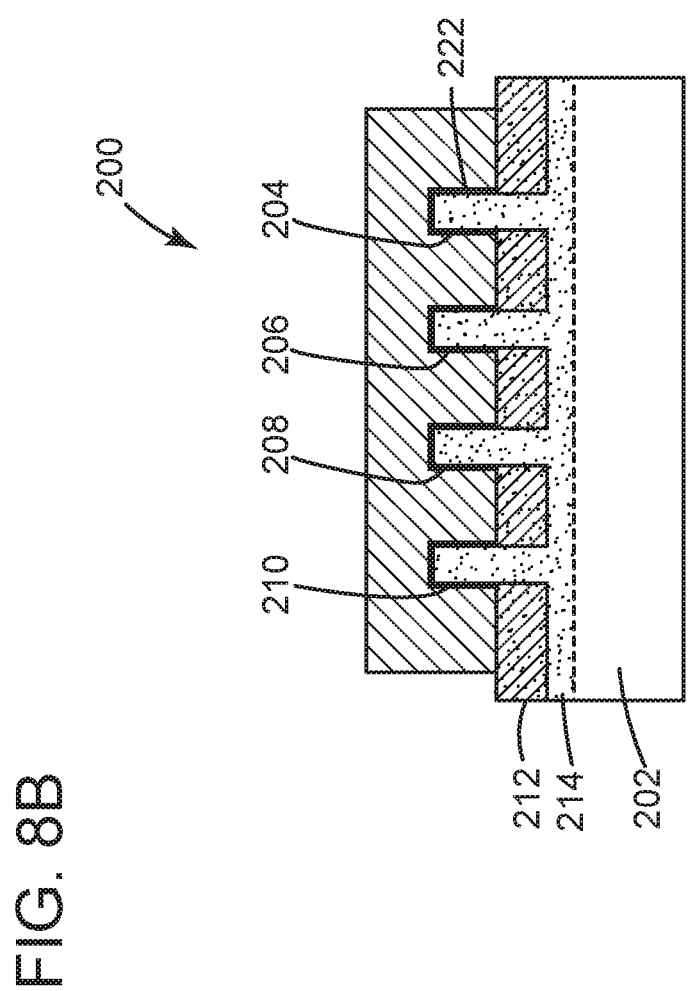
Figure 8C:
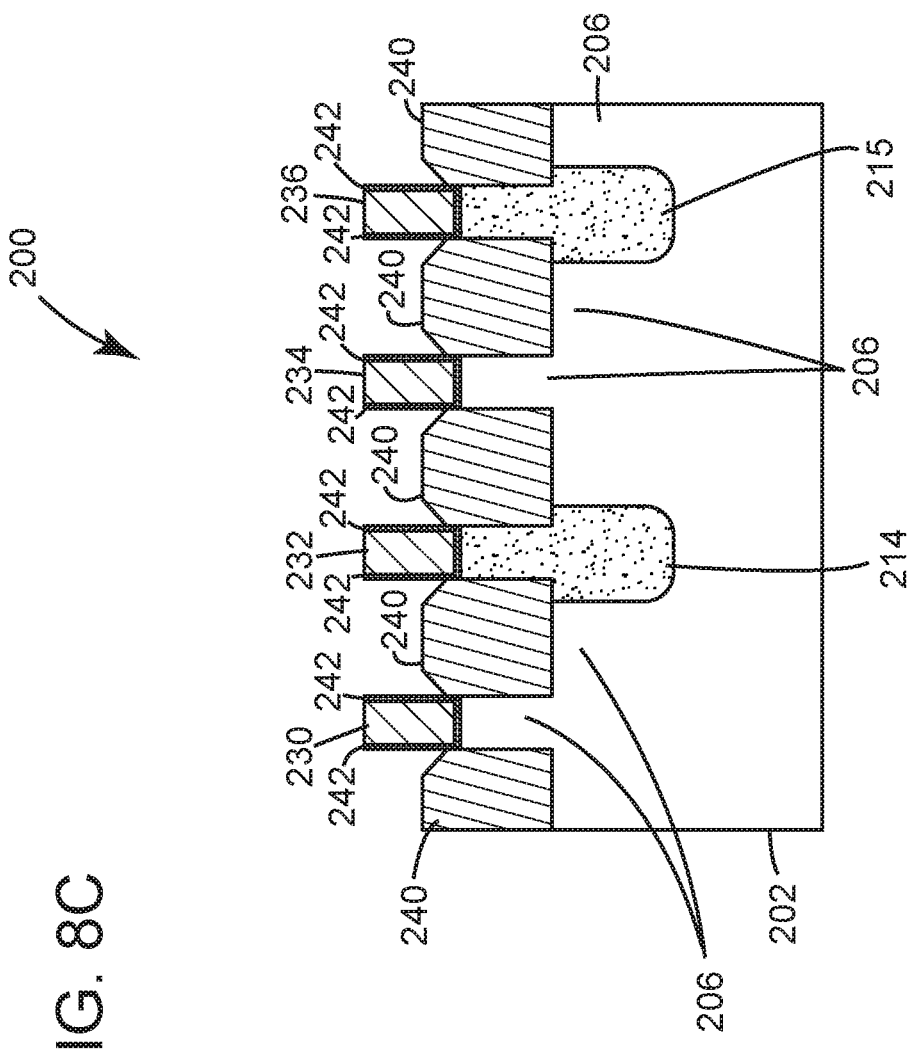
Figure 8D:
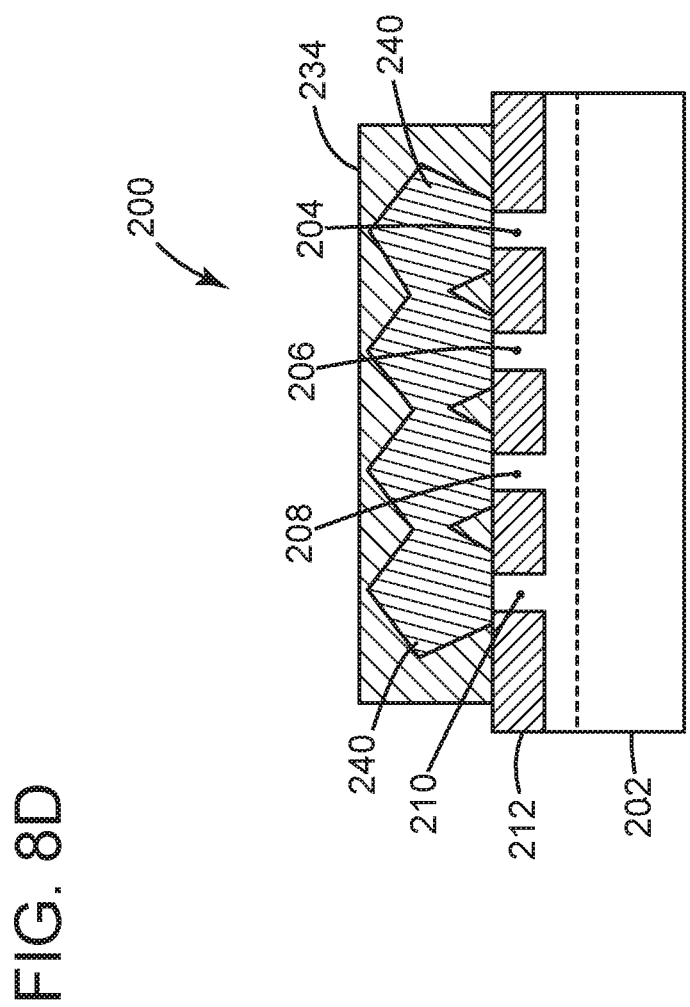
Figure 10A:
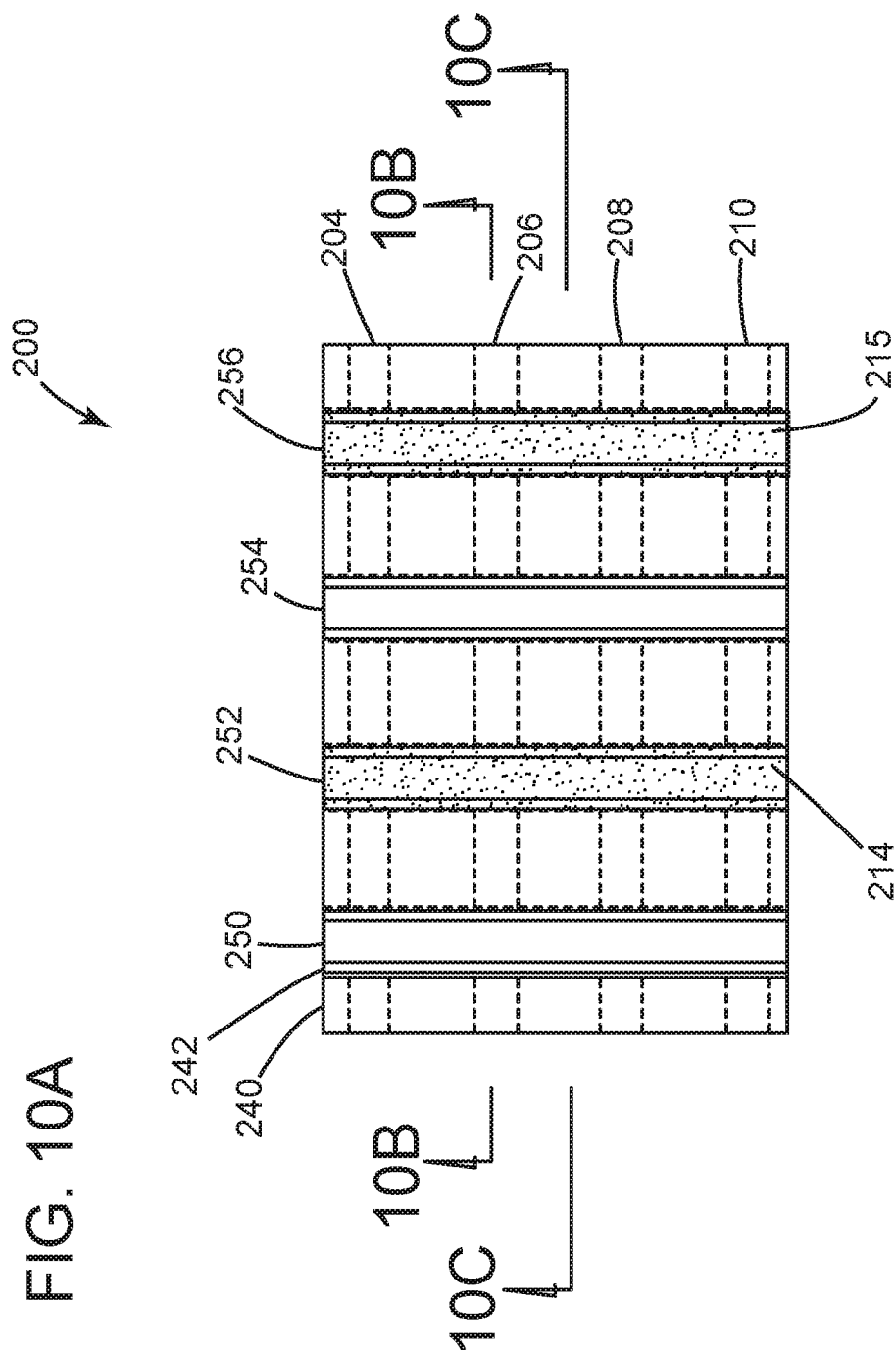
Figure 10C:
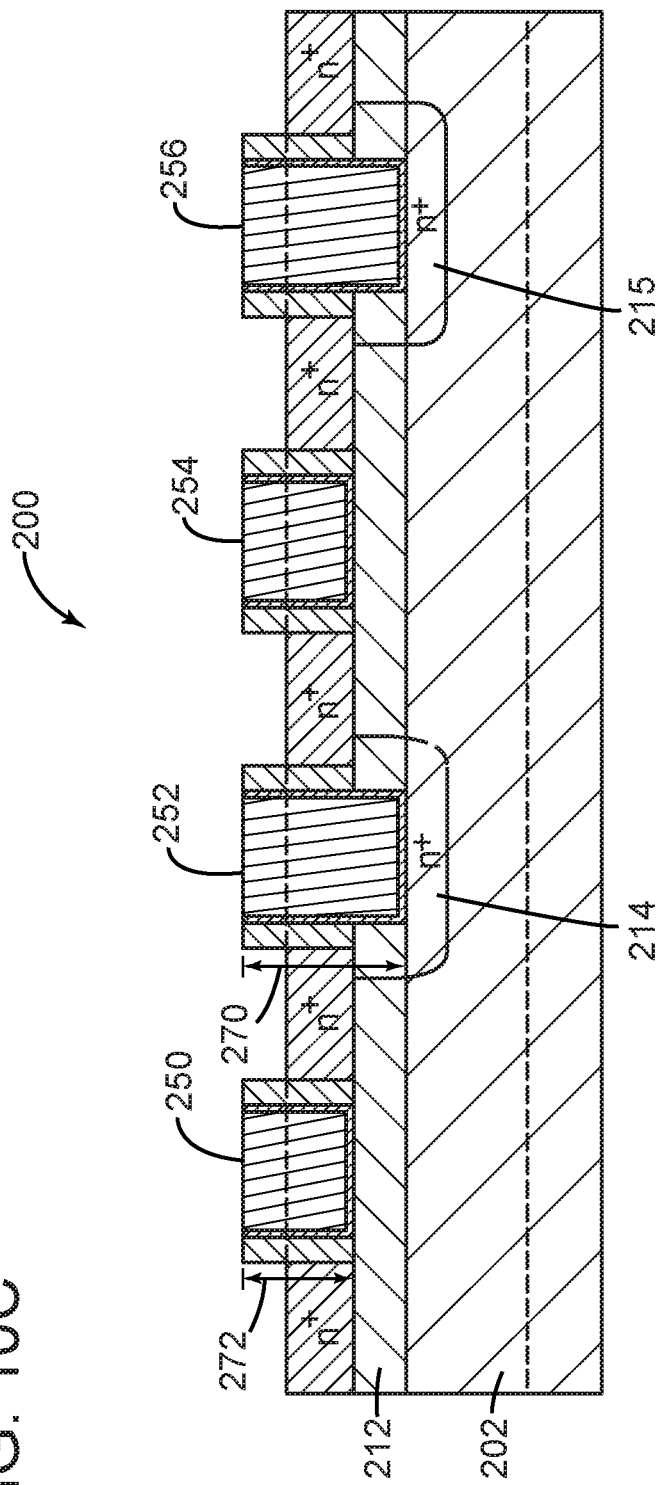
Figure 10C:
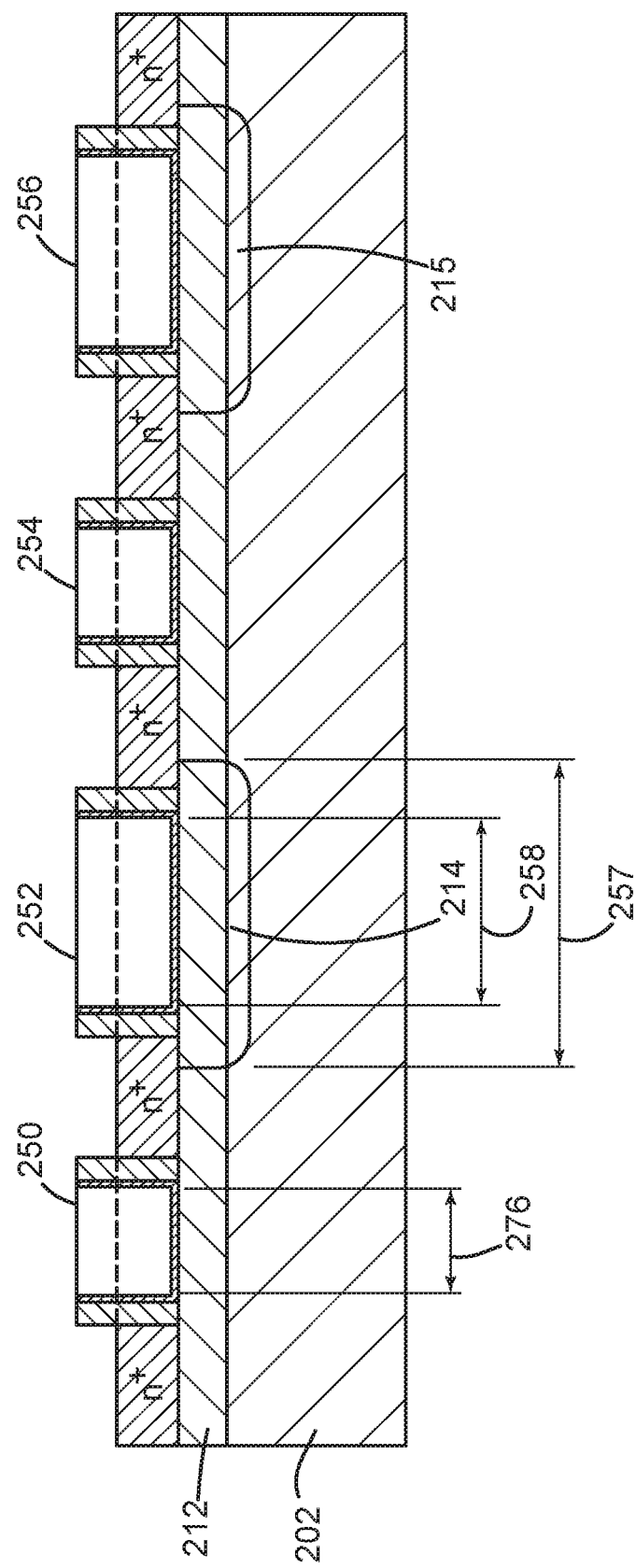

FIG. 3B, an electrical schematic diagram of the charge pump of FIG. 3A;

FIG. 4 is a simplified perspective view of an exemplary embodiment of a charge pump for an integrated circuit device having an array of fins disposed thereon at an intermediate stage of manufacturing in accordance with the present invention;

FIG. 5 is a perspective view of the charge pump of FIG. 4 having a flowable oxide layer disposed thereon and dopant regions implanted therein in accordance with the present invention;

FIG. 6A is a perspective view of the charge pump of FIG. 5 with the FOX layer recessed to expose an active portion of the fins;

FIG. 6B is a cross sectional view of FIG. 6A taken along the line 6B-6B;

FIG. 6C is a cross sectional view of FIG. 6A taken along the line 6C-6C;

FIG. 6C' is a cross sectional view of an alternative embodiment of a charge pump in accordance with the present invention;

FIG. 7A is a side view of the charge pump of FIG. 6C with a dummy gate layer disposed thereon in accordance with the present invention;

FIG. 7B is a side view of the charge pump of FIG. 7A taken along the line 7B-7B;

FIG. 8A is an exemplary embodiment of a top planar view of the charge pump of FIG. 7A after formation of dummy gates, spacers and deposition of an epitaxial layer in accordance with the present invention;

FIG. 8B is a side view of the charge pump of FIG. 8A taken along the line 8B-8B;

FIG. 8C is a side view of the charge pump of FIG. 8A taken along the line 8C-8C;

FIG. 8D is a side view of the charge pump of FIG. 8A taken along the line 8D-8D;

FIG. 9A is an exemplary embodiment of a top planar view of the charge pump of FIG. 8A having an insulating layer disposed thereon in accordance with the present invention;

FIG. 9B is a side view of the charge pump of FIG. 9A taken along the line 9B-9B;

FIG. 10A is an exemplary embodiment of a top planar view of the charge pump of FIG. 9A having replacement metal gates disposed thereon in accordance with the present invention;

FIG. 10B is a side view of the charge pump of FIG. 10A taken along the line 10B-10B;

FIG. 10C is a side view of the charge pump of FIG. 10A taken along the line 10C-10C;

FIG. 10C' is a cross sectional view of an alternative embodiment of a charge pump in accordance with the present invention; and FIG. 10C" is a cross sectional view of an alternative embodiment of a charge pump in accordance with the present invention.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Figure 1:
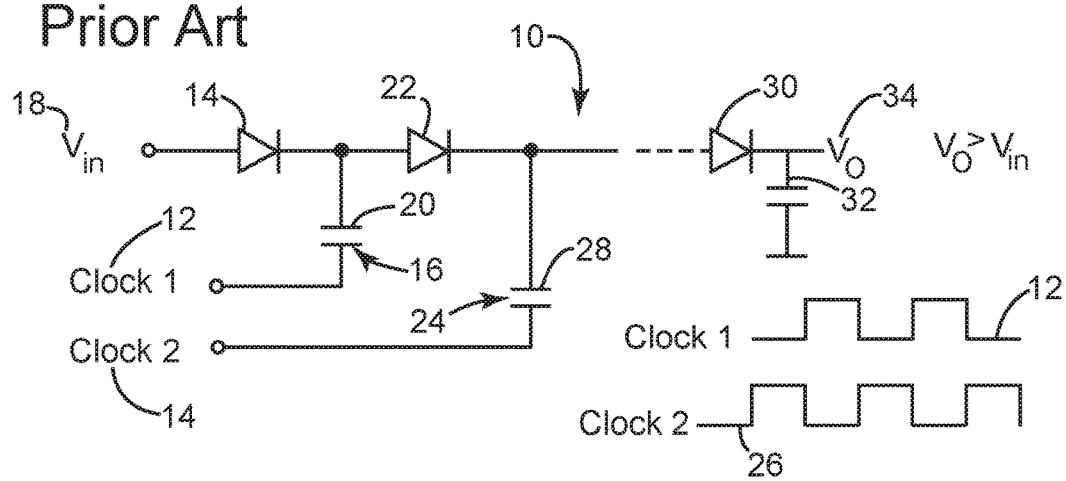
FIG. 1 is a prior art electrical schematic of a diode/capacitor charge pump.

Referring to FIG. 1, the ideal operation of a basic prior art diode/capacitor charge pump 10 will be described. The charge pump 10 includes a cascade of diode/capacitor cells with the bottom terminal of each capacitor driven by a clock pulse train. In this example, only the first two diode/capacitor cells (diode 14/capacitor 16 and diode 22/capacitor 24) are shown, though there can be many more.

During operation, when the clock-1 signal 12 is low, diode 14 will be forward biased and will charge capacitor 16 to the voltage input (Vin) 18. When the clock-1 signal 12 goes high the top terminal 20 of capacitor 16 is pushed up near to twice Vin 18 (i.e., "Vin 18" plus the pulse amplitude of "high clock-1 signal 12"). (Knowingly, the bias of terminal 20 will be less than 2× of Vin due to the diode threshold voltage ~0.7v and leakage through capacitor or transistors). Diode 14 is then reversed biased off while diode 22 is forward biased on and capacitor 24 begins to charge to nearly 2 times Vin 18. On the next clock cycle, clock-1 signal 12 again goes low and now clock-2 signal 26 goes high pushing the top terminal 28 of capacitor 24 to nearly 3 times Vin 18 (i.e., "Vin 18" plus "high clock-1 signal 12" plus "high clock-2 signal 26"). Diode 22 then switches off and so on with charge passing up the chain, hence the name charge pump.

Figure 2A:
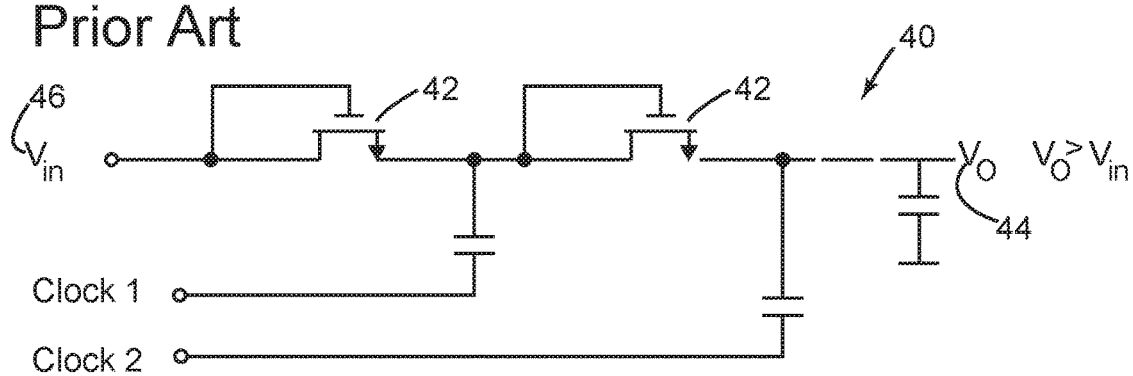
FIG. 2A is a prior art electrical schematic of an n-type transistor/capacitor charge pump.
Figure 2B:
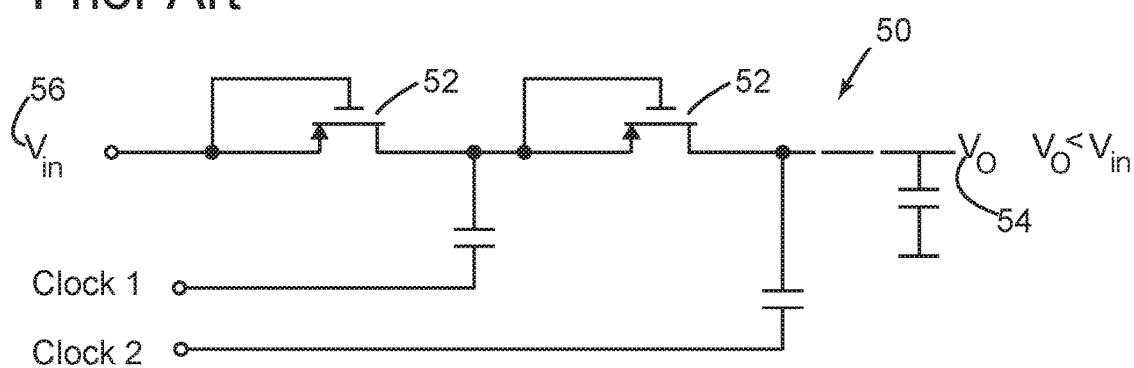
FIG. 2B is a prior art electrical schematic of a p-type transistor/capacitor charge pump.

Only two clock pulses (clock-1 signal 12 and clock-2 signal 26) are required. The clock-1 signal 12 is connected to every odd capacitor (capacitor 16 in this example) and the clock-2 signal 26 is connected to every even capacitor (capacitor 24 in this example) in the chain in order to continue the voltage pumping action. The final diode 30-capacitor 32 cell in the cascade is connected to ground rather than a clock phase and hence is not a multiplier. Rather the final capacitor 32 including those loading capacitance of additional circuitry (not shown) connected to output (Vo) 34, provides smoothing for the final voltage output (Vo) 34. The final output voltage depends on charge pump circuit parameters, e.g. the magnitude of capacitors, the frequency and amplitude of pulses, the diode threshold voltage, and the total loading to the output of charge pump. Referring to FIGS. 2A and 2B, schematic diagrams of basic prior art transistor/capacitor charge pumps are presented, wherein the diodes of FIG. 1 have been replaced by the n-type transistors and p-type transistors of FIGS. 2A and 2B respectively. Charge pumps are frequently employed in integrated circuits where the DC supply voltage (from a battery for instance) is lower than that required by the circuitry. The diodes of a charge pump are often replaced by transistors (such as MOSFETs, FinFETs, silicon on insulator (SOI) transistors, and the like) wired to function as a diode, which is referred to as a diode-wired transistor (more specifically in the exemplary embodiments of FIGS. 2A and 2B, a diode-wired MOSFET), so that the diode threshold voltage can be reduced to a smaller equivalent "diode" Vt of transistors (<0.3 v). Ideally, the best transistor for charge pump shall have Vt around 0 v. FIG. 2A shows a schematic of a charge pump 40 using diode-wired n-channel enhancement type MOSFETs 42 for a positive charge pump where Vo 44 is greater than Vin 46. FIG. 2B shows a charge pump 50 using diode-wired p-channel enhancement type MOSFETs 52 for a negative charge pump where Vo 54 is less than Vin 56. The Vin 56 in FIG. 2B can be biased to ground (i.e. 0 v) if a large negative output Vo 54 is desired.

FIGS. 3A-3B illustrate various exemplary embodiments of a charge pump in accordance with the present invention. FIGS. 4-10C" illustrate various exemplary embodiments of methods of forming a charge pump for an integrated circuit in accordance with the present invention.

Referring to FIG. 3A, a simplified cross sectional view of an exemplary embodiment of a charge pump 100 for an integrated circuit device in accordance with the present invention is presented. Referring to FIG. 3B, an electrical schematic diagram 102 of the charge pump 100 of FIG. 3A is also presented. For purposes of clarity, schematic symbols in FIG. 3B which functionally correspond to structural elements in FIG. 3A have the same reference numbers. By way of example, the p-well doped substrate of FIG. 3A has reference number 104 and the functionally corresponding p-well diodes of FIG. 3B have reference number 104.

Referring to FIG. 3A, charge pump 100 includes a p-well doped substrate 104 having fins 106 designed generally for fin field effect transistors (FinFETs). The fins 106 (illustrated as dashed lines since they normally would not be seen in this cross sectional view) extend vertically upward from the substrate 104 for a predetermined fin height (indicated by arrow 108) and horizontally across the length of substrate 104. Though a single fin 106 is illustrated, fin 106 can be one of a plurality of fins arranged in a parallel array of fins extending across substrate 104.

A flowable oxide (FOX) insulator layer 110 partially covers fins 106. The thickness (indicated by arrow 112) of the FOX layer 110 defines an inactive portion 114 and an active portion 116 of fins 106.

A first transistor 118 is disposed over the active portion 116 of fin 106 to form a FinFET transistor. The first transistor 118 includes an n-type doped first source region 120 and an n-type doped first drain region 122 disposed within the substrate 104. The first source 120 and first drain 122 regions define a first channel 124 (illustrated as dashed lines since they normally would not be seen in this cross sectional view) therebetween. A first gate 126, operable to control electrical conduction through the first channel 124, is disposed over three sides of first channel 124.

A second transistor 128 is disposed over the active portion 116 of fin 106 to form a FinFET transistor. The second transistor 128 includes an n-type doped second source region 130 and an n-type doped second drain region 132 disposed within the substrate 104. The second source 130 and second drain 132 regions define a second channel 134 (illustrated as dashed lines since they normally would not be seen in this cross sectional view) therebetween. A second gate 136, operable to control electrical conduction through the second channel 134, is disposed over three sides of second channel 134.

A first capacitor 138 is disposed between the first 118 and second 128 transistors. The first capacitor 138 includes a first metal terminal 140 and a first substrate terminal 142 with a first dielectric 144 therebetween. The first substrate terminal 142 is disposed within the substrate 104 and implanted with the same type dopant as the first source region 120, which in this case is an n-type dopant.

Importantly, the first substrate terminal 142 contacts the first drain region 122 and second source region 130 within the substrate 104. Since the first substrate terminal 142, first drain region 122 and second source region 130 are all implanted with the same n-type dopant, electrical continuity is provided therebetween without the use of any external interconnection (i.e. contacts and metal line). Therefore, the charge pump 100 is formed with a very compact design and requires a minimum of external metal interconnection wiring to function.

A second capacitor 146 is disposed over fin 106 adjacent to the second drain 132 of the second transistor 128. The second capacitor 146 includes a second metal terminal 148 and a second substrate terminal 150 with a second dielectric 152 therebetween. The second substrate terminal 150 is disposed within the substrate 104 and implanted with the same type dopant as the first source region 120, which in this case is an n-type dopant.

In repetitive fashion, the second substrate terminal 150 contacts the second drain region 132 of the second transistor 128 and a third source region 154 or a third transistor (not shown) within the substrate 104. Since the second substrate terminal 150, second drain region 132 and third source region 154 are all implanted with the same n-type dopant, electrical continuity is provided therebetween without the use of any external interconnection materials.

The first transistor 118 and first capacitor 138 compose a first transistor/capacitor cell of charge pump 100 while the second transistor 128 and second capacitor 146 compose a second transistor/capacitor cell of charge pump 100. Though only two transistor/capacitor cells are illustrated, one skilled in the art would recognize that there could be any number of cells which form charge pump 100.

To provide functionality, first source region 120 is electrically connected to a voltage input (Vin) 160. Additionally, the first and second transistors 118 and 128 are diode-wired 162 so that their sources 120 and 130 are in electrical continuity to their respective gates 126 and 136 (e.g., through contacts and metal layer). Also, the first metal terminal 140 of first capacitor 138 is connected to a clock-1 signal 156 (best seen in FIG. 3B) which has an amplitude substantially equal to Vin. Additionally, the second metal terminal 148 of second capacitor 146 is connected to a clock-2 signal 158 (best seen in FIG. 3B) of equal amplitude but opposite polarity.

Referring to FIG. 3B, the operation of charge pump 100 will be described. During operation, when the clock-1 signal 156 is low, first transistor 118 will be switched on and will charge first capacitor 138 to the voltage input (Vin) 160. When the clock-1 signal 156 goes high the first metal terminal 140 of first capacitor 138 is pushed up to nearly twice Vin 160 (i.e., "Vin 160" plus "high clock-1 signal 156" and minus the "diode" threshold voltage). First transistor 118 is then switched off while second transistor 128 is switched on and the second capacitor 146 begins to charge to 2 times Vin 160. On the next clock cycle, clock-1 signal 156 again goes low and now clock-2 signal 158 goes high pushing the second metal terminal 148 of the second capacitor 146 to nearly 3 times Vin 160 (i.e., "Vin 160" plus "high clock-1 signal 156" plus "high clock-2 signal 158" and minus one "diode" Vt). The second transistor 128 then switches off and so on with charge passing up the chain until it reaches the voltage output (Vo) 164. Finally, the n-p junction formed between the p-well 104 and the substrate terminals 142 and 148 acts as a reversed biased diode 104 to substantially prevent current flow into the p-well.

Significantly, because capacitors 138 and 146 have substrate terminals imbedded within the substrate 104 that are implanted with the same type dopant as the adjacent transistors in the charge pumps chain, and because substrate terminal makes electrical connection with the source and drain of adjacent transistors, there is electrical continuity therebetween. This continuity is established without the use of any external metal interconnection wiring.

The above embodiment illustrates a charge pump having n-type FinFET transistors. However, one skilled in the art would recognize that the charge pump can be composed of other transistors types, such as n-type or p-type metal oxide semiconductor field effect transistors (MOSFETs) or the like with proper polarity of "diode"-wiring. Additionally, integrated circuit may be based on a substrate on insulator (SOI) design.

FIGS. 4-10C" illustrate various exemplary embodiments of methods of forming a charge pump 200 for an integrated circuit in accordance with the present invention. Referring to FIG. 4, a simplified view of an exemplary embodiment of the charge pump 200 for an integrated circuit device in accordance with the present invention is presented at an intermediate stage of manufacturing. Charge pump 200 includes a p-well substrate 202 having an array 203 of fins 204, 206, 208 and 210 (i.e., 204-210) formed by well-known methods extending laterally across the substrate 202. Though illustrated as a p-well substrate, an n-well substrate could also be used. Though four fins are illustrated in array 203 for this embodiment, any number of fins may be included in the array.

Referring to FIG. 5, a flowable oxide (FOX) layer 212 is disposed over the fins 204-2010 of array 203 and planarized using such methods as chemical-mechanical polishing (CMP) to expose the tops of the fins. Next an n-type dopant is implanted in select dopant regions 214 and 215 along the fins 204-210 using well-known lithographic and implantation techniques. The dopant is implanted deep enough to penetrate the entire height of each fin 204-210, the FOX layer 212 and partially into substrate 202. The locations of the dopant regions 214 and 215 correspond to the predetermined locations of where capacitors in the charge pump structure 200 will be formed.

Referring to FIG. 6A, the FOX layer 212 is recessed using standard lithographic and etching processes that are well-known. The thickness 216 of the FOX layer 212 now defines an inactive region of the fins 204-210, and the exposed height 218 of the fins above the FOX layer now defines an active region of the fins.

Referring to FIG. 6B, a cross-sectional view of fin 206 of FIG. 6A taken through section line 6B-6B is presented. From this view, it can be seen that the dopant regions 214 and 215 extend entirely through fin 206 (as well as the other fins 204, 208 and 210), through the FOX layer 212 and partially into the p-well substrate 202.

Referring to FIG. 6C, a cross-sectional view of dopant region 215 of FIG. 6A taken through section line 6C-6C is presented. From this view, it can be seen that the dopant region 215 (as well as dopant region 214) is a single contiguous region which extends through each fin 204-210, the entire cross section of the FOX layer 212 and the substrate 202.

Referring to FIG. 6C', an alternative embodiment of a dopant region 215 is presented. In this embodiment dopant region 215 is not contiguous. Rather dopant region 215 is a plurality of dopant regions which extend across the width 219 of each fin 204-210. It is important that the dopant regions 215 have a width 220 that is greater than the fin width 219 in order to take into consideration overlay tolerances at the lower technology class sizes, such as the 10 nanometer class. This is because it is highly preferable that the capacitor's doped substrate terminals (such as substrate terminals 142 and 150 of FIGS. 3A and 3B) utilize the entire surface of the fins and even extend beyond the fins in order to make proper electrical contact with adjacent transistors in the charge pump 200.

Referring to FIGS. 7A and 7B, an oxide layer 222 is disposed over the charge pump 200. Next a polysilicon dummy gate layer 224 is disposed over the oxide layer 222. Oxide layer 222 may be formed by thermally oxidizing the exposed surface of fins 204-210, or may be deposited onto fins 204-210 using, for example, chemical vapor deposition (CVD) or atomic layer deposition (ALD). The polysilicon dummy gate layer 224 is deposited over oxide layer 222 using well-known processes such as chemical vapor deposition (CVD) or the like. Following the deposition, dummy gate layer 224 can be planarized to facilitate subsequent gate formation steps, using for example chemical-mechanical polishing (CMP).

Referring to FIG. 8A, an exemplary embodiment of a top planar view of the charge pump structure 200 after formation of dummy gates 230, 232, 234 and 236 (i.e., 230-236), spacers 242 and deposition of epitaxial layer 240 is presented. Dummy gates 230-236 are created by etching the polysilicon dummy gate layer 224 of FIG. 7A using well-known processes such as standard lithographic processes and anisotropic dry etching.

Referring to FIG. 8B, a cross-sectional view of dummy gate 232 of FIG. 8A taken through section line 8B-8B is presented. As can be seen, the dummy gate 232 is formed over substantially the entire length of n-type dopant region 214, selected exposed portions of fins 204-210 and oxide layer 222. Dummy gate 232 (as well as dummy gates 230, 234 and 236) is also disposed on portions of the exposed surfaces of the FOX layer 212 without penetrating into FOX layer 212.

Referring back to FIG. 8A, the spacers 242 are located on the sidewalls of the dummy gates 230-236. Spacers 242 are formed by disposing a conformal coat of spacer material, such as silicon nitride, over the patterned dummy gates 230-236 and anisotropic etching the spacer material.

After dummy gates 230-236 and spacers 242 are formed, the upper portions of fins 204-210 are etched down to, in this exemplary embodiment, about the FOX layer 212 (best seen in FIG. 8D). Thereafter an epitaxial layer 240 is deposited on the remaining exposed portions of fins 204-210. A doped epitaxial layer 240 of n-type (or in other embodiments p-type) silicon may be grown on the surface of fins 204-210 using, for example, selective epitaxy, wherein the epitaxial layer 240 grows only from the exposed portion of fins 204-210. These doped areas form the source and drain regions of the FinFET transistors of charge pump 200.

Referring to FIG. 8C, a cross-sectional view of fin 206 of FIG. 8A taken through section line 8C-8C is presented. As can be seen from this view, the epitaxial layer 240 is deposited on portions of fin 206 in areas directly adjacent to dummy gates 230-236.

Referring to FIG. 8D, a cross-sectional view of FIG. 8A taken through section line 8D-8D is presented. From this view it can be seen that the epitaxial layer 240 has a faceted growth over fins 204-210. A faceted epitaxial growth may be preferred because of improved electrical characteristics such as reduced parasitic resistance and capacitance (to adjacent gate). Faceted epitaxial growth can be accomplished with certain epitaxy conditions such as CVD with increased temperature and decreased pressure.

Referring to FIG. 9A, a top planar view of the deposition of insulating layer 244 over the epitaxial layer 240 is presented. Referring to FIG. 9B a cross sectional view of the insulating layer 244 and fin 206 is also presented.

The insulating layer 244 can be any insulating material such as SiO2 deposited over epitaxial layer 240 and dummy gates 230-236 using, for example, CVD or ALD. Insulating layer 244 is deposited to a thickness greater than the height of dummy gates 230-236. The surface of insulating layer 244 can then be planarized using CMP to expose the top portion of dummy gates 230-236 (best seen in FIG. 9B).

Referring to FIG. 10A, a top planar view of the replacement metal gates (RMG) 250, 252, 254, 256 (i.e., 250-256) of the charge pump structure 200 is presented. The RMG process typically starts with the removal of dummy gates 230-236 using a wet chemical etch, such as potassium hydroxide (KOH), or a dry etch such as RIE, leaving gate trenches. The gate trench sidewalls include the spacers 242. The gate trench bottoms include the exposed portions of fins 204-210 and exposed portions of the FOX layer 212.

Referring to FIG. 10B, a cross sectional view of fin 206 and RMG 250-256 of FIG. 10A taken through section line 10B-10B is presented. After the gate trenches are formed, a dielectric 260 (best seen in FIG. 10B), such as a high-k dielectric or the like, is conformally coated over the entire surface of the charge pump 200 including the gate trenches. Metal is then disposed over the dielectric layer to fill the trenches and form RMG 250-256. The metal overflow is then planarized back to expose the top surface of RMG 250-256, resulting in the structure shown in FIG. 10B.

RMG 250-256 may include various layers as determined by electrical performance requirements of the transistors including a workfunction setting metal and a fill metal. The workfunction setting metal may be a material such as titanium nitride (TiN) or tantalum nitride (TaN) deposited over the dielectric 260. The fill metal is deposited over the workfunction setting metal, filling the gate trench with, for example, tungsten (W) or aluminum (Al).

Referring to FIG. 10C, a cross sectional view of epitaxial layer 240 between fins 206 and 208 of FIG. 10A taken through sectional line 10C-10C is presented. As can be seen, with the formation of the RMG 250-256, the structure of charge pump 200 of FIG. 10C is complete and is substantially identical to the structure of charge pump 100 of FIG. 3A.

The first transistor 262 of charge pump 200 is formed by gate 250 and its associated first source and first drains formed by the adjacent portions of epitaxial layer 240. The second transistor 264 of charge pump 200 is formed by gate 254 and its associated second source and second drains formed by the adjacent portions of epitaxial layer 240. The first capacitor 266 is formed by gate 252 as the first metal terminal, dielectric 260 as the first dielectric of capacitor 266 and dopant region 214 as the first substrate terminal of the capacitor 266. The second capacitor 268 is formed by gate 256 as the second metal terminal, dielectric 260 as the second dielectric of capacitor 268 and dopant region 215 as the second substrate terminal of the capacitor 268.

It is important to note that dopant regions 214 and 215 (and therefore, the first and second capacitor substrate terminals) have a length 257 that is larger than the length 258 of the respective first and second capacitor metal terminals 252 and 256, such that good electrical contact is made between capacitor substrate terminals of the capacitors 266, 268 and the source and drains of the adjacent transistors 262, 264. In this way, the design of the charge pump 200 is very compact and metal interconnection wiring is minimized.

Referring to FIG. 10C', an alternative embodiment of charge pump 200 is presented wherein the metal terminals (RMG 252 and 256) of capacitors 266, 268 have a much larger height 270 than the height 272 of the gates (RMG 250, 254) of transistors 262, 264 in the charge pump 200 chain. This can be accomplished by selectively etching the exposed portions of the FOX layer 212 in the gate trenches after the dummy gates 230-236 has been removed and prior to depositing the RMG 250-256 into the trenches. By increasing the height of the metal terminals 252, 256, the surface area of the capacitors 266, 268 are also increased, resulting in a greater capacitance.

Referring to FIG. 10C", another alternative embodiment of charge pump 200 is presented wherein the length 258 of metal terminals (RMG 252 and 256) of capacitors 266, 268 is larger than the length 276 of the gates (RMG 250, 254) of transistors 262, 264 in the charge pump 200 chain. This can be accomplished by selectively etching the polysilicon dummy gate layer 224 of FIG. 7A using well-known processes such as standard lithographic processes and anisotropic dry etching to provide dummy gates having greater lengths over the capacitor areas than the transistor areas of the charge pump structure 200. By increasing the length of the metal terminals 252, 256, the surface area of the capacitors 266, 268 are also increased, resulting in a greater capacitance.

It is highly desirable, however, to assure that along with an increase in the metal terminal length 258 there is a corresponding increase in substrate terminal length 257, such that the substrate terminal lengths 257 are still larger than the metal terminal lengths 258 of the capacitors 266, 268. Again, this is done to assure good electrical continuity (i.e., good electrical contact) between capacitor substrate terminals of the capacitors 266, 268 and the source and drains of the adjacent transistors 262, 264. In this way, the design of the charge pump 200 is kept very compact and metal interconnection wiring is kept to a minimum.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A charge pump for an integrated circuit, the charge pump comprising:
    a substrate having an array of fins disposed thereon;
    a flowable oxide (FOX) layer disposed over the array of fins;
    a first transistor including first source and first drain regions disposed within the substrate and defining a first channel therebetween, the first source and first drain regions implanted with one of an n-type and a p-type dopant;
    a second transistor including second source and second drain regions disposed within the substrate and defining a second channel therebetween, the second source and second drain regions implanted with the same type dopant as the first source region;
    a first capacitor including a metal terminal and a substrate terminal with a dielectric therebetween, the substrate terminal disposed within the substrate and implanted with the same type dopant as the first source region, the substrate terminal contacting the first drain region and second source region within the substrate to provide electrical continuity therebetween
    a plurality of second capacitors disposed in the array of fins; and
    dopant regions of the array of fins and the FOX layer implanted with the same type dopant as the first source region, the locations of the dopant regions corresponding to locations of a plurality of substrate terminals of the first and second capacitors in the charge pump.

2. The charge pump of claim 1 comprising the first capacitor substrate terminal having a length that is greater than a length of the first capacitor metal terminal.

3. The charge pump of claim 1 comprising:
    the first transistor having a first gate operable to control electrical conduction through the first channel; and
    the second transistor having a second gate operable to control electrical conduction through the second channel.

4. The charge pump of claim 3 comprising the first capacitor metal terminal having a length that is greater than a length of the first and second gates.

5. The charge pump of claim 3 comprising the first capacitor metal terminal having a height that is greater than a height of the first and second gates.

6. The charge pump of claim 3 comprising:
the first source region electrically interconnected to the first gate; and
the second source region electrically interconnected to the second gate.

7. The charge pump of claim 1 wherein both the first and second transistors are fin field effect transistor (FinFET).

8. The charge pump of claim 1 comprising a plurality of transistor/capacitor cells.

9. The charge pump of claim 8 wherein the plurality of transistor/capacitor cells are disposed over a fin of the array of fins.

10. A method comprising:
providing a substrate for a charge pump;
doping the substrate with one of a p-type and an n-type dopant to form a first source region and first drain region of a first transistor within the substrate, the first source region and first drain region defining a first channel region therebetween;
doping the substrate with the same type dopant to form a second source region and second drain region of a second transistor within the substrate, the second source region and second drain region defining a second channel region therebetween; and
doping the substrate with the same type dopant to form a first substrate terminal of a first capacitor within the substrate such that the first substrate terminal contacts the first drain region and second source region within the substrate to provide electrical continuity therebetween to form the charge pump;
forming an array of fins in the substrate;
disposing a flowable oxide (FOX) layer over the array of fins; and
implanting the same type dopant into dopant regions of the array of fins and FOX layer, the locations of the dopant regions corresponding to predetermined locations of where a plurality of substrate terminals of capacitors in the charge pump will be formed.

11. The method of claim 10 comprising:
forming a first metal terminal of the first capacitor; and
doping the first substrate terminal of the first capacitor such that the first substrate terminal has a length that is greater than a length of the first metal terminal.

12. The method of claim 10 comprising:
forming a first gate for the first transistor, the first gate operable to control electrical conduction through the first channel;
forming a second gate for the second transistor, the second gate operable to control electrical conduction through the second channel; and
forming a first metal terminal of the first capacitor such that a length of the first metal terminal is greater than a length of the first and second gates.

13. The method of claim 12 comprising forming the first metal terminal of the first capacitor such that a height of the first metal terminal is greater than a height of the first and second gates.

14. The method of claim 10 comprising:
recessing the FOX layer to expose an active portion of the fins;
disposing a dummy gate layer over the FOX layer and the exposed active portion of the fins;
etching the dummy gate layer to provide a plurality of dummy gates over the active portion of the fins such that every other dummy gate is disposed over a dopant region; and
disposing spacers on sidewalls of the dummy gates.

15. The method of claim 14 comprising:
removing the dummy gates to form a plurality of gate trenches, the gate trenches having gate trench sidewalls which include the spacers and gate trench bottoms which include exposed portions of the fins and the FOX layer; and
disposing a plurality of replacement metal gates into the gate trenches;
wherein the dopant regions function as the substrate terminals of the capacitors, the replacement metal gates over the dopant regions function as metal terminals of the capacitors and the remaining replacement metal gates function as gates for transistors in the charge pump.

16. The method of claim 15 comprising:
selectively etching the exposed portions of the FOX layer in the gate trenches after the dummy gates have been removed and prior to disposing the replacement metal gates into the trenches; and
disposing the replacement metal gates into the trenches to provide the metal terminals of the capacitors having a height that is larger than a height of the gates for the transistors in the charge pump.

17. The method of claim 16 comprising:
selectively etching the dummy gate layer to provide the plurality of dummy gates such that the dummy gates disposed over the dopant regions have a width that is larger than a width of the remaining dummy gates;
removing the dummy gates to form the plurality of gate trenches; and
disposing the plurality of replacement metal gates into the gate trenches to provide the metal terminals of the capacitors having a width that is larger than a width of the gates of the transistors in the charge pump.

18. The method of claim 17 comprising:
forming an expitaxial layer over the fins and between the replacement metal gates to provide source and drain regions for the transistors in the charge pump;
wherein source regions and drain regions adjacent to substrate terminals make contact with the substrate terminals to provide electrical continuity therebetween to form the charge pump.

* * * * *